(12) United States Patent
Huang

(10) Patent No.: US 11,393,747 B2
(45) Date of Patent: Jul. 19, 2022

(54) SUBSTRATE STRUCTURE HAVING ROUGHNED UPPER SURFACE OF CONDUCTIVE LAYER

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/008,324

(22) Filed: Aug. 31, 2020

(65) Prior Publication Data

US 2022/0068783 A1    Mar. 3, 2022

(51) Int. Cl.
*H01L 23/498* (2006.01)
*H01L 23/00* (2006.01)
*H01L 49/02* (2006.01)
*H01L 21/48* (2006.01)

(52) U.S. Cl.
CPC .... *H01L 23/49838* (2013.01); *H01L 21/4846* (2013.01); *H01L 24/04* (2013.01); *H01L 24/05* (2013.01); *H01L 24/06* (2013.01); *H01L 28/84* (2013.01)

(58) Field of Classification Search
CPC ... H01L 23/49838; H01L 24/04; H01L 24/05; H01L 24/06; H01L 28/84
See application file for complete search history.

(56) References Cited

U.S. PATENT DOCUMENTS

| 2004/0134682 A1* | 7/2004 | En | C25D 5/625 174/258 |
| 2006/0072055 A1* | 4/2006 | Ukawa | G02F 1/133555 349/114 |
| 2007/0013049 A1* | 1/2007 | Asai | H05K 3/4661 257/700 |
| 2007/0026671 A1* | 2/2007 | Kim | H01L 21/76843 438/648 |
| 2009/0288870 A1* | 11/2009 | Kondo | H05K 3/4661 174/261 |
| 2013/0072012 A1* | 3/2013 | Tseng | H05K 3/426 438/613 |
| 2014/0083745 A1* | 3/2014 | Shimizu | H05K 3/4652 174/251 |
| 2016/0133555 A1* | 5/2016 | Nakamura | H05K 3/427 257/774 |
| 2018/0130759 A1* | 5/2018 | Ho | H01L 24/81 |
| 2018/0376602 A1* | 12/2018 | Matsuura | B32B 15/08 |
| 2020/0075517 A1* | 3/2020 | Kim | H01L 24/20 |

* cited by examiner

*Primary Examiner* — Michael Jung
(74) *Attorney, Agent, or Firm* — Foley & Lardner LLP

(57) ABSTRACT

A substrate structure and a method for manufacturing the same are provided. The substrate structure includes a first conductive layer, a dielectric layer, a second conductive layer and a connection layer. The dielectric layer is disposed on the first conductive layer. The dielectric layer defines an opening exposing the first conductive layer. The second conductive layer is disposed on the dielectric layer. The connection layer extends from an upper surface of the first conductive layer to a lateral surface of the second conductive layer. A surface roughness of an upper surface of the second conductive layer ranges from about 0.5 μm to about 1.25 μm.

16 Claims, 8 Drawing Sheets

SUBSTRATE STRUCTURE HAVING ROUGHNED UPPER SURFACE OF CONDUCTIVE LAYER

BACKGROUND

1. Field of the Disclosure

The present disclosure relates to a substrate structure, and particularly to a method of manufacturing a substrate structure using a sacrificial layer.

2. Description of the Related Art

As semiconductor devices develop, the size of the substrate structure is decreased. For example, a thinner metal layer and/or a smaller aperture of via, defined by the metal layer, is crucial to decrease the size of the substrate structure.

However, it faces many problems to form a substrate structure with such a thinner metal layer with a smaller via formed therein. For example, it is difficult to control the aperture of the via through a wet etching process when the metal layer has a thickness less than 18 μm. Moreover, when a dry etching process is performed on the metal layer, a crater structure is often generated due to a small aperture of the via. Therefore, a new substrate structure is required to solve aforementioned problems.

SUMMARY

In some embodiments, a substrate structure includes a first conductive layer, a dielectric layer, a second conductive layer and a connection layer. The dielectric layer is disposed on the first conductive layer. The dielectric layer defines an opening exposing the first conductive layer. The second conductive layer is disposed on the dielectric layer. The connection layer extends from an upper surface of the first conductive layer to a lateral surface of the second conductive layer. A surface roughness of an upper surface of the second conductive layer ranges from about 0.5 μm to about 1.25 μm.

In some embodiments, a method for manufacturing a substrate structure includes: providing a substrate including a first conductive layer, a dielectric layer on the first conductive layer, and a second conductive layer on the dielectric layer; forming a sacrificed layer on the second conductive layer; performing a laser drilling process to form a via exposing the first conductive layer; and removing the sacrificed layer.

In some embodiments, a method for manufacturing a substrate structure includes: providing a substrate including a first conductive layer, a dielectric layer on the first conductive layer, and a second conductive layer on the dielectric layer; forming an adjustment layer on the second conductive layer; performing a laser drilling process to form a via penetrating the second conductive layer, and the dielectric layer and exposing the first conductive layer, wherein the via has an aperture at an open end of the via, the laser drilling process comprises emitting a laser beam through the adjustment layer, and the aperture of the via is determined by adjusting a thickness of the adjustment layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
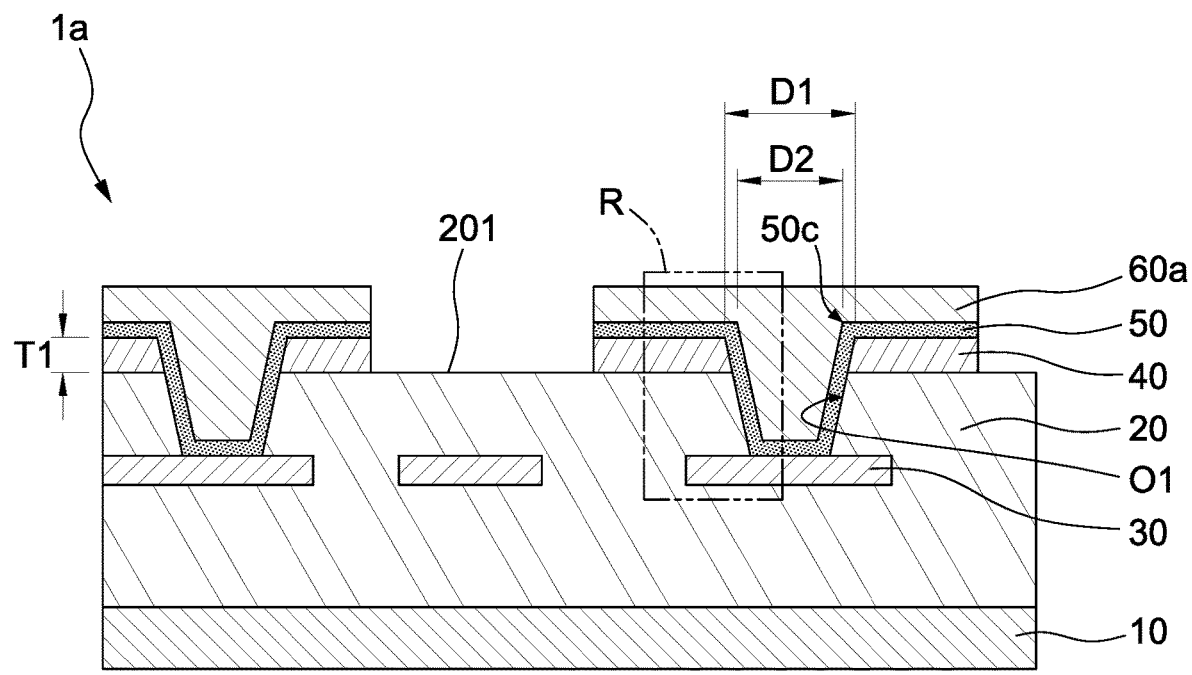
FIG. 1 illustrates a cross-sectional view of an example of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 1 illustrates a cross-sectional view of an example of a substrate structure 1a according to some embodiments of the present disclosure. In some embodiments, the substrate structure 1a may include a conductive layer 10, a dielectric layer 20, a conductive layer 30, a conductive layer 40, a connection layer 50 and an electrode structure 60a.

In some embodiments, the material of the conductive layer 10 may include copper (Cu), aluminum (Al), iron (Fe), nickel (Ni), chromium (Cr), molybdenum (Mo), manganese (Mn) or a combination thereof.

The dielectric layer 20 may be disposed on the conductive layer 10. The dielectric layer 20 may include Prepreg (PP), Ajinomoto build-up film (ABF) or other suitable materials. In some embodiments, a resin material used in the core substrate may be a fiber-reinforced resin so as to strengthen the core substrate, and the reinforcing fibers may be, without limitation to, glass fibers or Kevlar fibers (aramid fibers). Some conductive trace(s), pad(s), contact(s), via(s), for electrical connection, may be disposed in the dielectric layer 20.

In some embodiments, the conductive layer 30 may be embedded in the dielectric layer 20. A portion of the dielectric layer 20 may be disposed on the conductive layer 30. The dielectric layer 20 may define a plurality of openings O1 exposing a portion of the conductive layer 30. The conductive layer 30 may include metal, metal alloy or other suitable materials. The conductive layer 30 may be patterned such that the conductive layer 30 may have multiple portions that are separated and electrically isolated from each other.

In some embodiments, the conductive layer 40 may be disposed on the dielectric layer 20. The conductive layer 40 may be disposed on a surface 201 (or an upper surface) of the dielectric layer 20. A portion of the surface 201 of the dielectric layer 20 may be exposed from the conductive layer 40. The conductive layer 40 may be located over the conductive layer 30. In some embodiments, the conductive layer 40 may be disposed adjacent to the opening O1 of the dielectric layer 20. The conductive layer 40 may surround the opening O1 of the dielectric layer 20. The conductive layer 40 may include metal, metal alloy or other suitable materials. In some embodiments, the conductive layer 40 may include an imperfect structure.

In some embodiments, the conductive layer 40 may include a ring shape surrounding the opening O1 of the dielectric layer 20 from a top view (not shown). The conductive layer 40 may defines an aperture D1. In some embodiments, the aperture D1 may be greater than 0 and less than about 60 μm. In some embodiments, the aperture D1 may be greater than 0 and less than about 40 μm.

The conductive layer 40 may have a thickness T1. In some embodiments, the thickness T1 may be greater than 0 and less than 1 μm. In some embodiments, the thickness T1 may range from 1 μm to 2 μm. In some embodiments, the thickness T1 may range from 2 μm to 3 μm. In some embodiments, the thickness T1 may range from 3 μm to 4 μm. In some embodiments, the thickness T1 may range from 4 μm to 5 μm. In some embodiments, the portion of the conductive layer 40 adjacent to the opening O1 has the thickness T1, which is substantially equal to the thickness of the conductive layer 30 exposed from the opening O1.

In some embodiments, the connection layer 50 may be disposed on the conductive layer 40. The connection layer 50 may continuously extend from the conductive layer 40 to the conductive layer 30. The connection layer 50 may serve as, without limitation, a seed layer on which a metal layer, such as the electrode structure 60a, is formed during an electroplating process. In some embodiments, the connection layer 50 may be in contact with the conductive layer 40. In some embodiments, the connection layer 50 may be in contact with the conductive layer 30. In some embodiments, the connection layer 50 may be in contact with the dielectric layer 20. The connection layer 50 may cover a portion of the dielectric layer 20. The connection layer 50 may include, for example, copper or other suitable materials. The connection layer 50 may have a thickness greater than 0 and less than about 3 μm. The connection layer 50 may have a recess defining an aperture D2 at an open end 50c of the connection layer 50. In some embodiments, the aperture D2 may be greater than 0 and less than about 60 μm. In some embodiments, the aperture D2 may be greater than 0 and less than about 40 μm.

In some embodiments, the electrode structure 60a may be disposed on the connection layer 50. The electrode structure 60a may fill the openings O1 defined by the dielectric layer 20. The electrode structure 60a may be electrically connected to the conductive layer 30. In some embodiments, a portion of the electrode structure 60a may protrude out the openings O1 of the dielectric layer 20. That is, the portion of the electrode structure 60a, protruding out the openings O1, may be located over the surface 201 of the dielectric layer 20. In some embodiments, a portion of the dielectric layer 20 may be exposed from the electrode structure 60a. The electrode structure 60a may be configured to electrically connect the electronic components (not shown), such as die(s), capacitor(s) or inductor(s), and the conductive layer 30. The electrode structure 60a may include metal, metal alloy or other suitable materials.

Figure 2:
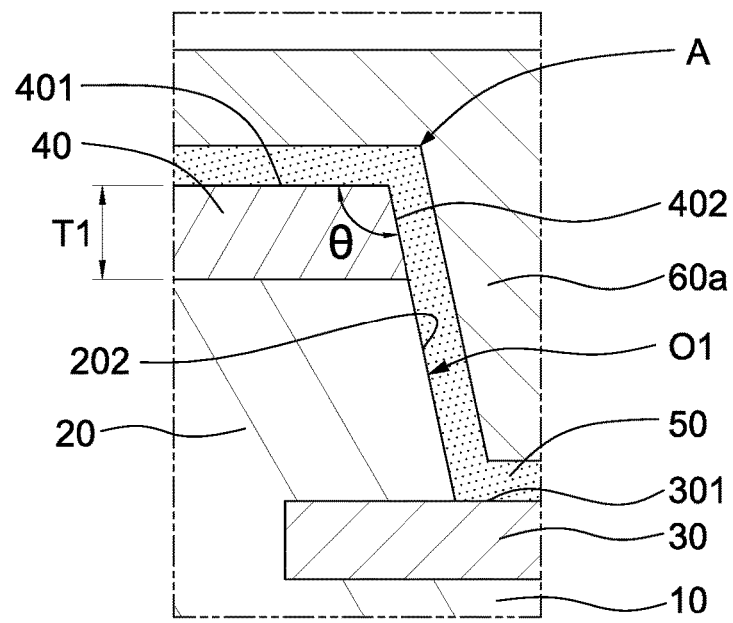
FIG. 2 illustrates an enlarged view of the substrate structure shown in FIG. 1.

FIG. 2 illustrates an enlarged view of region R of the substrate structure 1a shown in FIG. 1. As shown in FIG. 2, the dielectric layer 20 may include a surface 202 (or a lateral surface), which defines the opening O1. The conductive layer 30 may include a surface 301 (or an upper surface), which is exposed from the dielectric layer 20. The conductive layer 40 may include a surface 401 (or an upper surface) and a surface 402 (or a lateral surface). In some embodiments, the surface 402 may be coplanar with the surface 202. That is, the surface 402 and the surface 202 may constitute a continuously surface. In some embodiments, the slope of the surface 402 is substantially the same as that of the surface 202. In some embodiments, an angle θ constituted by the surface 401 and the surface 402 may range from 100° to about 110°. In some embodiments, the connection layer 50 may extend from the surface 401 of the conductive layer 40 to the surface 301 of the conductive layer 30 through the surface 402 of the conductive layer 40 and the surface 202 of the dielectric layer 20. The connection layer 50 may in contact with the surface 402 of the conductive layer 40 and the surface 202 of the dielectric layer 30. In some embodiments, the surface 401 is substantially flat and there is no protrusion formed on the surface 401.

In some embodiments, the conductive layer 40 may have an arris edge A defined by the surface 401 and the surface 402 of the conductive layer 40. More specifically, there may be no protruding or bump formed on the surface 401 or surface 402 near corner defined by the surface 401 and surface 402. Since no protruding or bump is formed on the surface 401, the thickness T1 of the conductive layer 40 adjacent to the opening O1 may be substantially the same as that far away from the opening O1 of the dielectric layer 20. That is, the conductive layer 40 may have a uniform thickness in the vicinity of the opening O1 of the dielectric layer 20.

Figure 3:
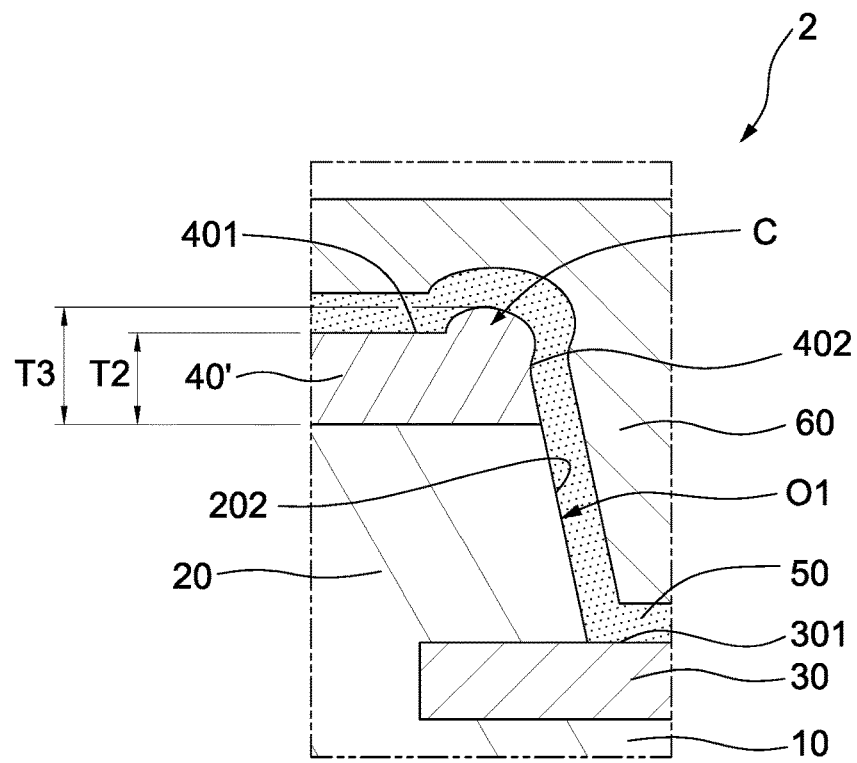
FIG. 3 illustrates a cross-sectional view of a substrate structure of a comparative example.

FIG. 3 illustrates a cross-sectional view of a substrate structure 2 of a comparative example. The conductive layer 40' may have a thickness T3 near the opening O1 of the dielectric layer 20. The conductive layer 40' may have a thickness T2 far away from the opening O1 of the dielectric layer 20. As shown in FIG. 3, the conductive layer 40' may have a protrusion C on the surface 401. The protrusion C may be adjacent to the opening O1 of the dielectric layer 20. No arris edge is formed in the corner defined by the surface 401 and the surface 402 of the conductive layer 40'. Since the protrusion C is formed on the surface 401 of the conductive layer 40', the thickness T3 may be greater than the thickness T2. In the comparative example, the slope of the surface 402 is not the same as that of the surface 202 because of protrusion C. Further, in the comparative example, the thickness T3 of the conductive layer 40' near the opening O1 is not the same as the thickness of the conductive layer 30 exposed from the opening O1.

Figure 4:
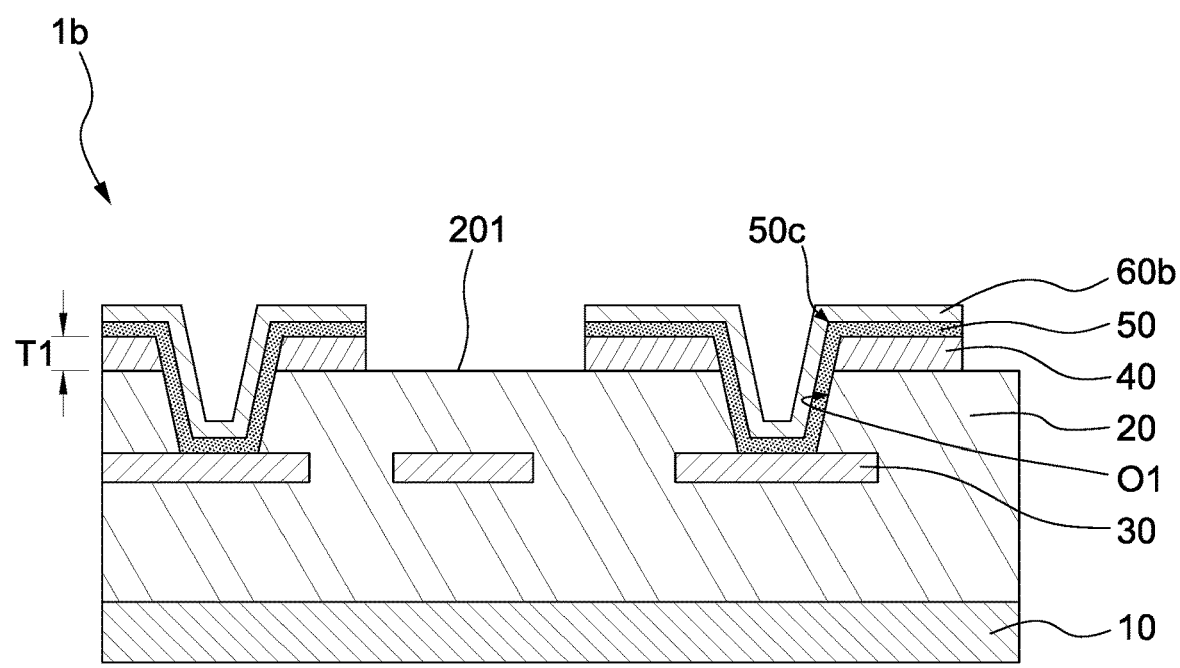
FIG. 4 illustrates a cross-sectional view of an example of a substrate structure according to some embodiments of the present disclosure.

FIG. 4 illustrates a cross-sectional view of an example of a substrate structure 1b according to some embodiments of the present disclosure. The substrate structure 1b of FIG. 4 has a structure similar to that of the substrate structure 1a of FIG. 1 with differences that the electrode structure 60b of the substrate structure 1b may be conformally disposed on the connection layer 50. In some embodiments, the electrode structure 60b over the surface 401 may have a thickness substantially the same as that over the surface 301.

FIG. 5A, FIG. 5B, FIG. 5C, FIG. 5D, FIG. 5E, FIG. 5F, FIG. 5G, FIG. 5H and FIG. 5I illustrate various stages of an example of a method for manufacturing a substrate structure 1a according to some embodiments of the present disclosure.

Figure 5A:
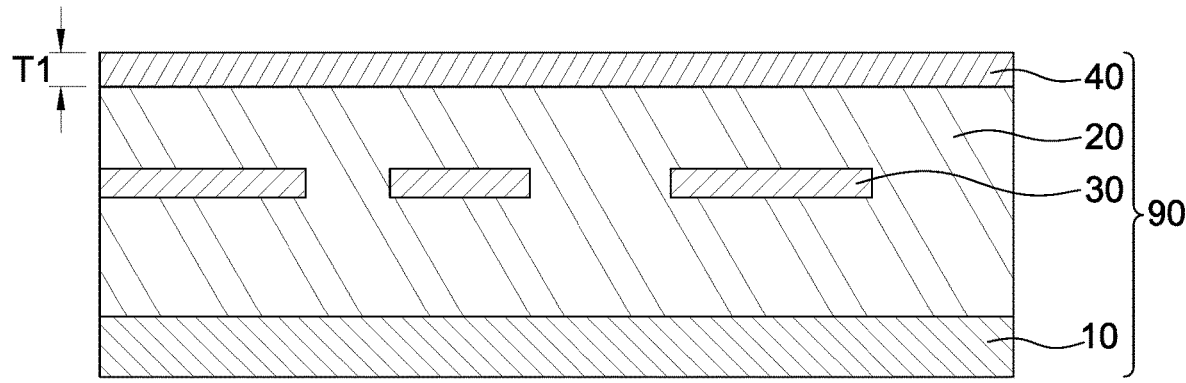
FIG. 5A, FIG. 5B, FIG. 5C, FIG. 5D, FIG. 5E, FIG. 5F, FIG. 5G, FIG. 5H and FIG. 5I illustrate various stages of an example of a method for manufacturing a substrate structure according to some embodiments of the present disclosure.

Referring to FIG. 5A, a substrate 90 is provided. The substrate 90 may include a conductive layer 10, a dielectric layer 20, a conductive layer 30 and a conductive layer 40. In some embodiments, the dielectric layer 20, the conductive layer 30 and the conductive layer 40 may be formed on the conductive layer 10 by multiple processes. For example, a first portion of the dielectric layer 20 may be coated on the conductive layer 10, and a conductive material may be formed on the first portion of the dielectric layer 20 and then patterned to form the conductive layer 30. Next, a second portion of the dielectric layer 20 may be formed to cover the conductive layer 30, and the conductive layer 40 may be formed on the dielectric layer 20, thereby producing the substrate 90. In some embodiments, the conductive layer 40 may have a thickness less than 5 μm.

Figure 5B:
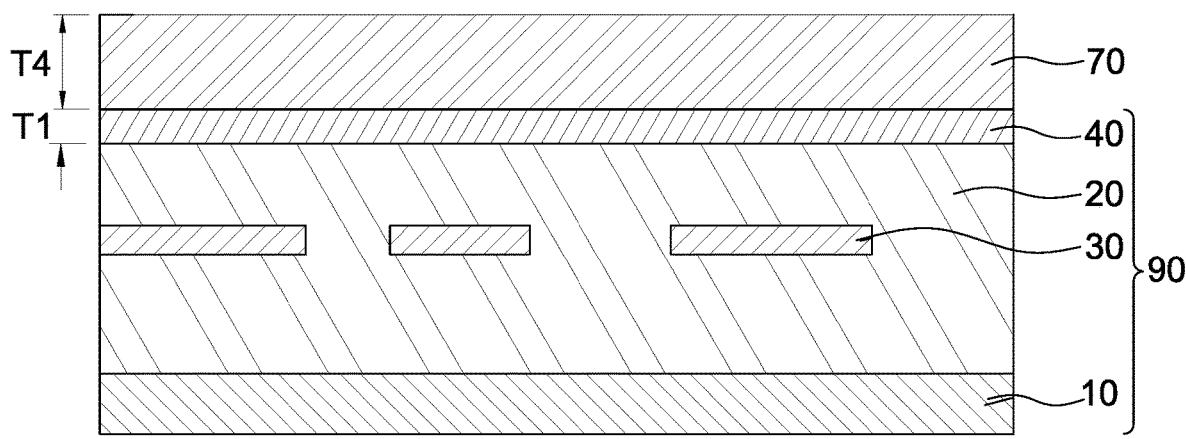

Referring to FIG. 5B, a sacrificial layer 70 may be formed on the conductive layer 40. In some embodiments, the sacrificial layer 70 may include a dielectric material. In some embodiments, the sacrificial layer 70 may include a photoresist. In some embodiments, the sacrificial layer 70 may include a negative photoresist.

In some embodiments, the sacrificial layer 70 may have a thickness T4. The thickness T4 may be configured to determine the aperture of the conductive layer 40 formed in the subsequent process. Therefore, the sacrificial layer 70 may also be referred to as an adjustment layer. In addition, the sacrificial layer 70 may be configured to prevent from a protrusion being formed on the conductive layer 40 in the subsequent process.

Figure 5C:
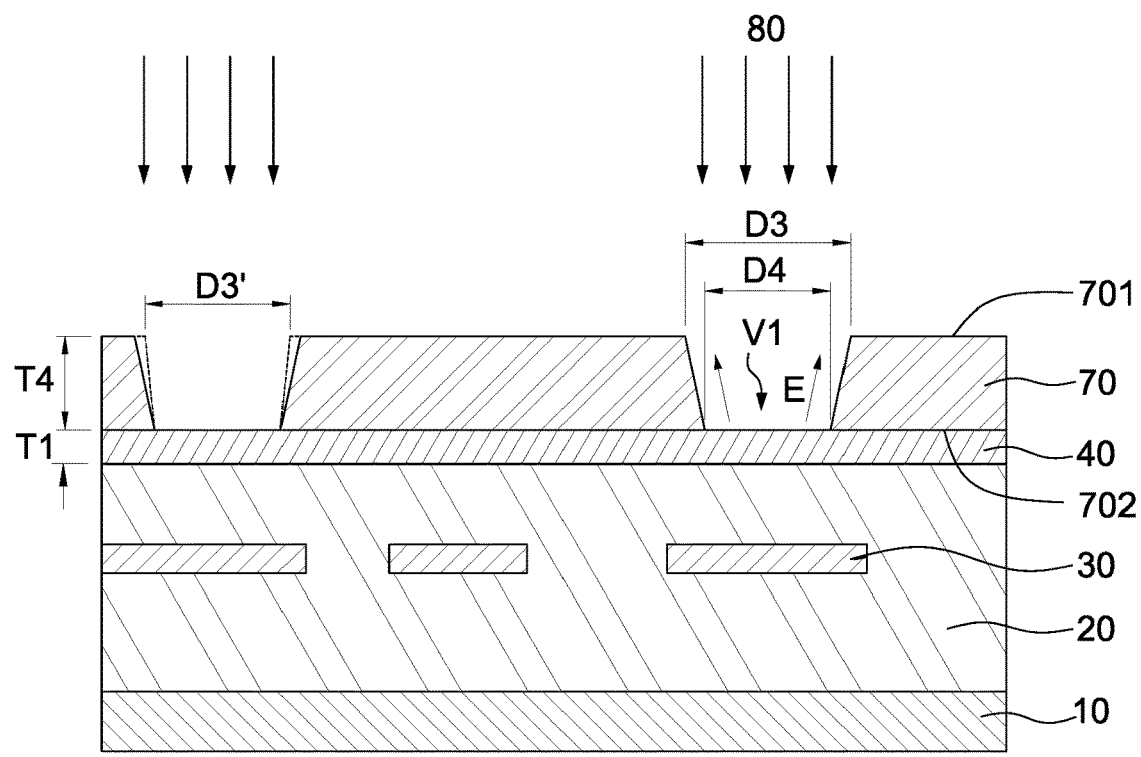

Referring to FIG. 5C, a laser drilling process 80 may be performed to form a via V1. In some embodiments, the laser drilling process 80 may include using a $CO_2$ laser, which may have a wavelength of about 10600 nm. In some embodiments, the laser drilling process 80 may include using an ultraviolet (UV) laser, which may have a wavelength of 266 nm or 355 nm. The laser beam E used in the laser drilling process 80 may have a solid angle of divergence. In some embodiments, the solid angle of divergence of the laser beam E is about 75° such that the laser beam E may be tapered toward its incident direction.

When the sacrificial layer 70 is removed by the laser drilling process 80, the sacrificial layer 70 may have an aperture D3 at a surface 701 (or an upper surface) and an aperture D4 at a surface 702 (or a lower surface) of the sacrificial layer 70. The aperture D4 may be different from the aperture D3. The aperture D4 may be determined by the thickness T4 of the sacrificial layer 70, the aperture of D3, and the solid angle of divergence of the laser beam E. The solid angle of divergence of the laser beam E and the aperture D3 may be controlled. Therefore, the aperture D4 of the sacrificial layer 70 may be controlled by adjusting the thickness T4 of the sacrificial layer 70. In some embodiments, the sacrificial layer 70 may also be determined by the energy of the laser beam E.

In addition, the laser beam E may be reflected. As shown in FIG. 5C, when the laser beam E is incident to the surface 401 of the conductive layer 40, the laser beam E may be reflected to the surface 701 of the sacrificial layer 70, which causes a deviation of the aperture at the surface 701 of the sacrificial layer 70. For example, when the laser beam E is incident to the surface 701 of the sacrificial layer 70 before the laser beam E is reflected, the sacrificial layer 70 may have an aperture D3' at the surface 701; after the laser beam E is reflected to the surface 703 of the sacrificial layer 70, the aperture D3' may be enlarged such that the sacrificial layer 70 have the aperture D3. Since the sacrificial layer 70 will be removed in the subsequent process, the deviation of the aperture of the sacrificial layer 70 may have a greater tolerance.

Figure 5D:
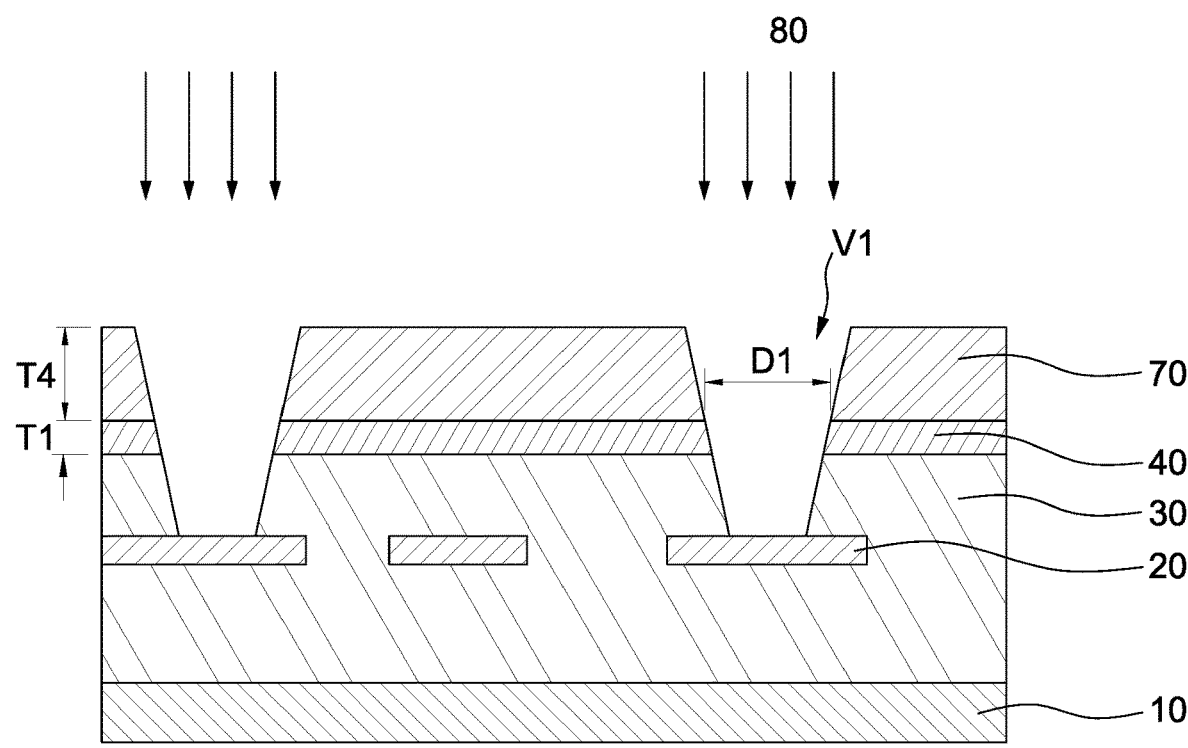

Referring to FIG. 5D, the laser drilling process 80 may be performed until the surface 301 of the conductive layer 30 is exposed, thereby forming the via V1. The via V1 may penetrate the sacrificial layer 70, the conductive layer 40 and the dielectric layer 20. The aperture D1 of the conductive layer 40 may be substantially the same as the aperture D4 of the sacrificial layer 70. The aperture D1 of the conductive layer 40 may be determined by the aperture D4 of the sacrificial layer 70. Therefore, the aperture D1 of the conductive layer 40 may also be determined by adjusting the thickness T4 of the sacrificial layer 70. In addition, the aperture D1 of the conductive layer 40 may also be determined by the energy of laser beam. When the conductive layer 40 is removed by a laser, the lattice of the conductive layer 40 may be destroyed so that the lateral surface (e.g., the surface 402) of the conductive layer 40 may have an imperfect lattice structure. In a comparative example using a wet etching process to remove the conductive layer, the lateral surface of the conductive layer may have a step height with a size of one or more lattices. Further, the aperture defined by the sacrificial layer 70 is greater than that defined by the conductive layer 40. Further, the conductive layer is substantially not removed during the laser drilling process 80. Therefore, the thickness of the conductive layer 30 before the laser drilling process 80 is substantially the same that after the laser drilling process 80.

Figure 5E:
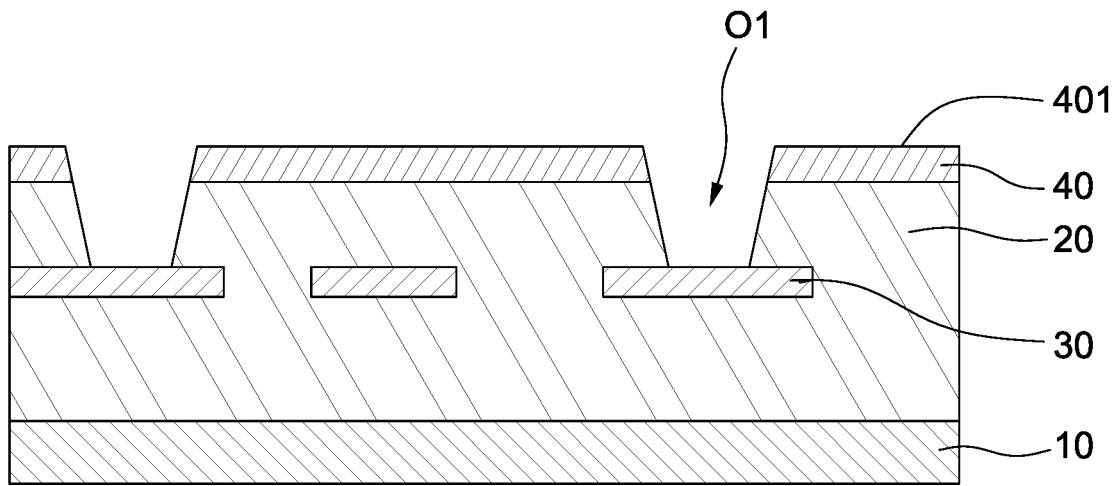

Referring to FIG. 5E, the sacrificial layer 70 may be removed after the opening O1 of the dielectric layer 20 is formed. In some embodiments, the sacrificial layer 70 may be removed by a stripping process or other suitable process.

In this embodiment, the conductive layer 40 is free from pre-etching. Pre-etching can brown the conductive layer 40 to facilitate defining the position of impinging the laser beam E. Further, the comparative semiconductor device structure may have a conductive layer with greater thickness, and therefore a pre-etching process is required to form the via penetrating the conductive layer. In a conventional process, the conductive layer 40 is browned by pre-etching before impinging the laser beam E. However, when the thickness of the conductive layer 40 is less than 5 μm, the laser beam E may be prone to over-etch the conductive layer 40 because of its less thickness. Further, when the conductive layer 40 is brown, the conductive layer 40 may have a roughness greater than 1.25 μm due to pre-etching. In this embodiment, pre-etching of the conductive layer 40 may be omitted because the thickness of the conductive layer 40 is less than 5 μm. As a result, the conductive layer 40 may have a relatively less roughness. In some embodiments, the surface roughness of the surface 401 of the conductive layer 40 may range from about 0.5 μm to about 1.25 μm. In some embodiment, an alignment mark (not shown) may be formed on the edge of the substrate 90. For example, the alignment mark may be defined by a pattern of the conductive layer 40, which is visible due to transparency of the sacrificial layer 70.

Further, in a conventional process, the laser drilling process is performed without a sacrificial layer, which may generate a protrusion, such as protrusion C shown in FIG. 3, on the upper surface or lateral surface of the conductive layer 40. When the thickness of the conductive layer 40 is less than 5 μm, this protrusion may adversely affect the performance of a high frequency semiconductor device. In this embodiment, the formation of the sacrificial layer 70 may restrain formation of protrusion on the surface 401 of the conductive layer 40. Therefore, the substrate structure 1a may be applied to a high frequency semiconductor device.

Moreover, when the aperture of the conductive layer 40 is less than 60 μm, the design of trace(s) for fan-out may be improved. However, it is difficult to form such a smaller aperture by a laser drilling process. In this embodiment, such a smaller aperture of the conductive layer 40 may be formed by controlling the thickness of the sacrificial layer 70.

Figure 5F:
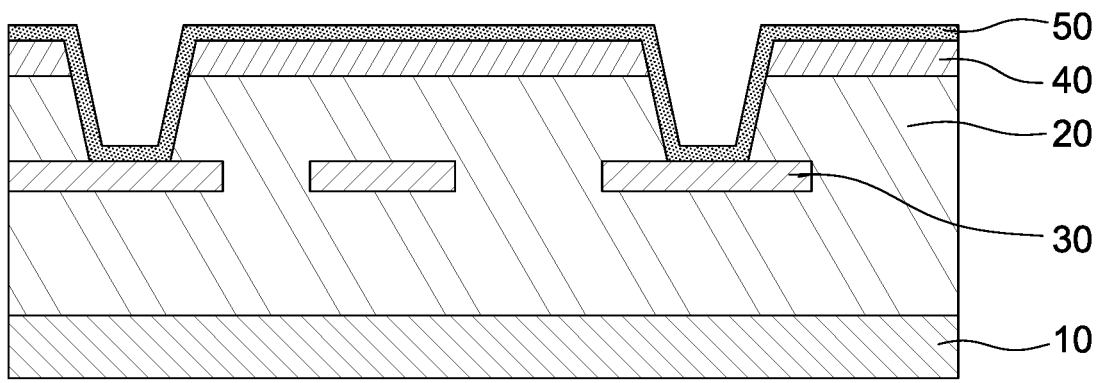

Referring to FIG. 5F, a connection layer 50 may be conformally on the conductive layer 40, dielectric layer 20 and conductive layer 30. The connection layer 50 may be formed by a physical vapor deposition (PVD) or other suitable process.

Figure 5G:
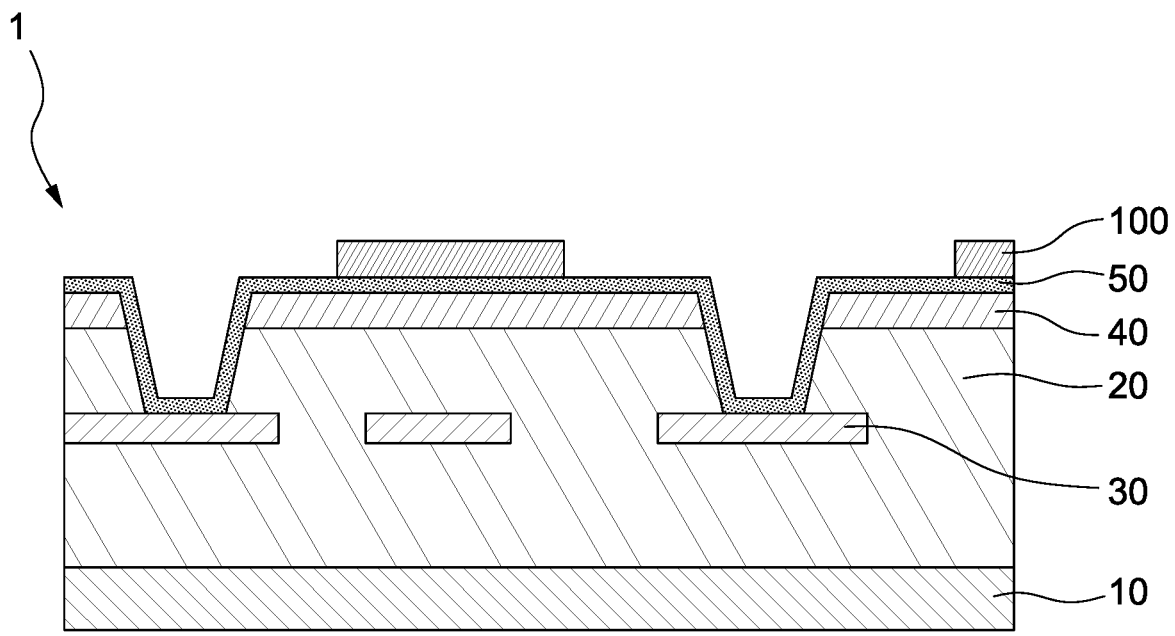

Referring to FIG. 5G, a mask layer 100 may be formed on the connection layer 50. The mask layer 100 may cover a portion of the connection layer 50. The mask layer 100 is configured to define the pattern of the electrode structure 60a. The mask layer 100 may include, for example, a photoresist or other suitable materials.

Figure 5H:
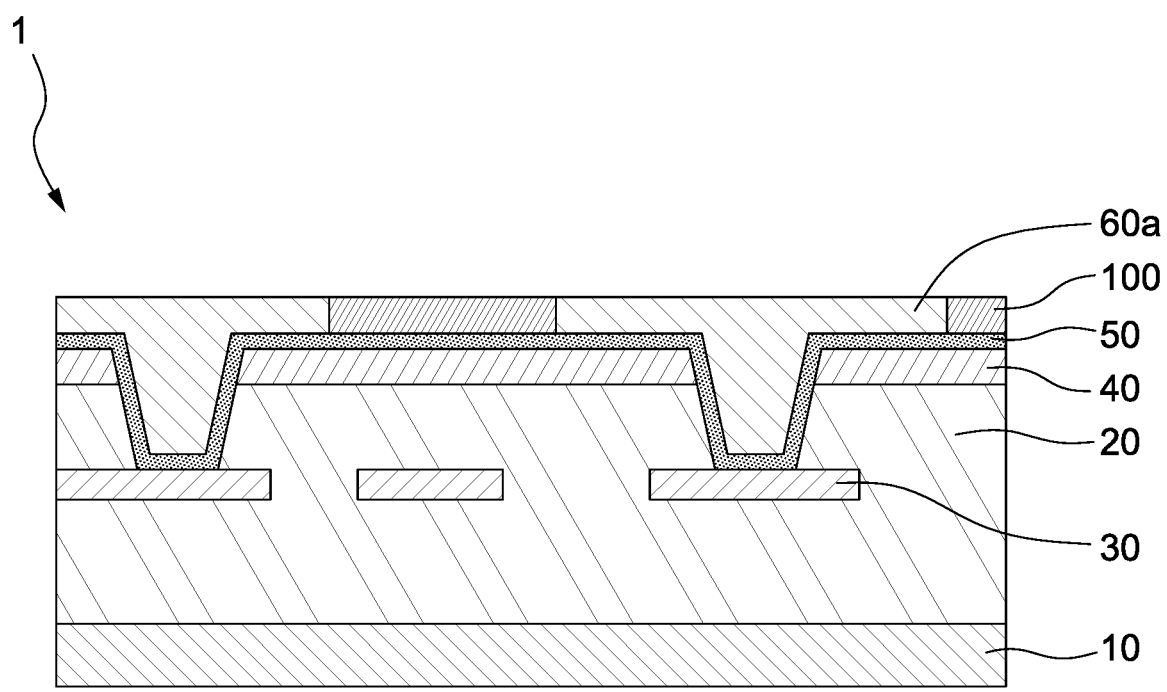

Referring to FIG. 5H, the electrode structure 60a may be formed on the uncovered portion of the connection layer 50. The electrode structure 60a may be formed by an electroplating process or other suitable processes.

Figure 5I:
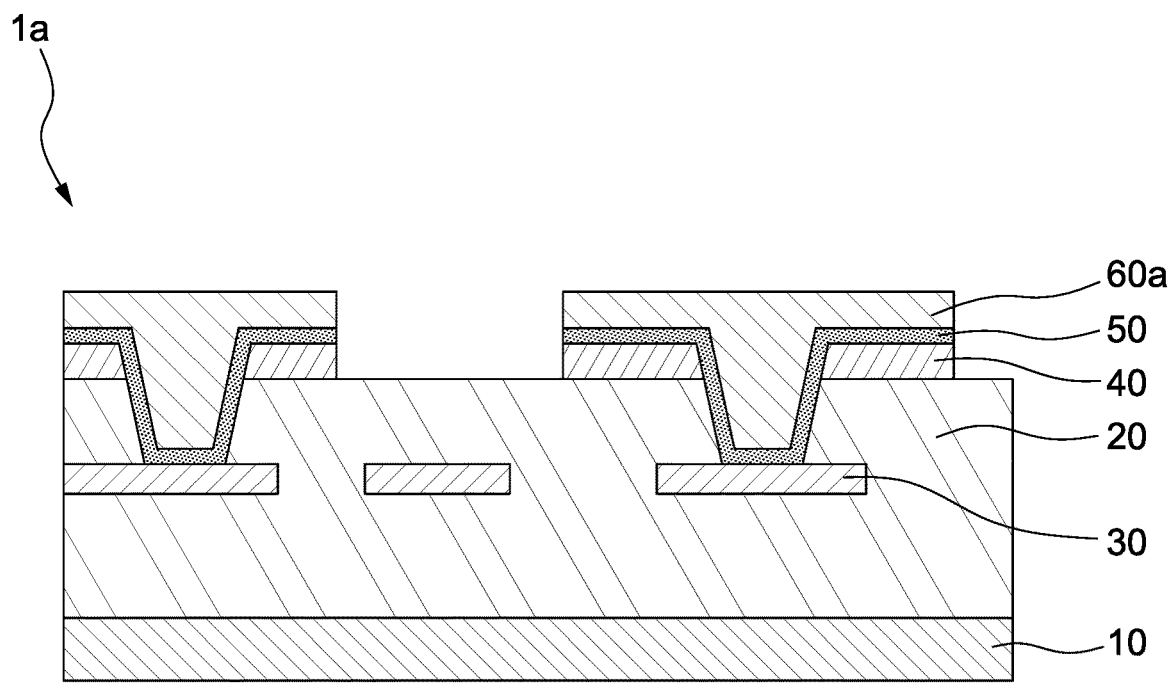

Referring to FIG. 5I, the mask layer 100 may be removed. Further, the portion of the electrode structure 60, connection layer 50 and conductive layer 40 directly under the mask layer 100 may also be removed such that a portion of the dielectric layer 20 may be exposed. As a result, the substrate structure 1a is formed.

Figure 6A:
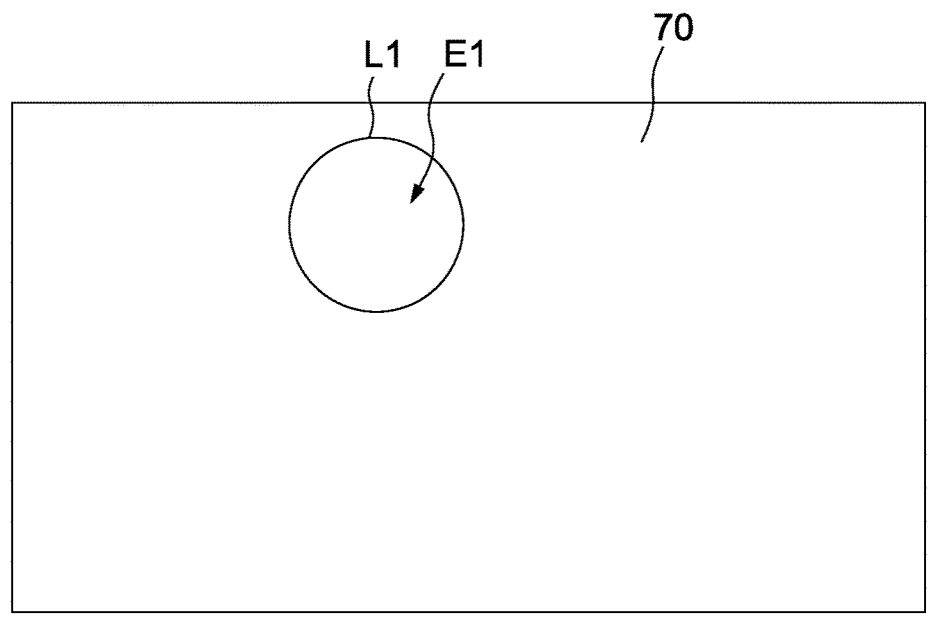
FIG. 6A, FIG. 6B and FIG. 6C illustrate various stages of an example of impinging laser beam according to some embodiments of the present disclosure.
Figure 6B:
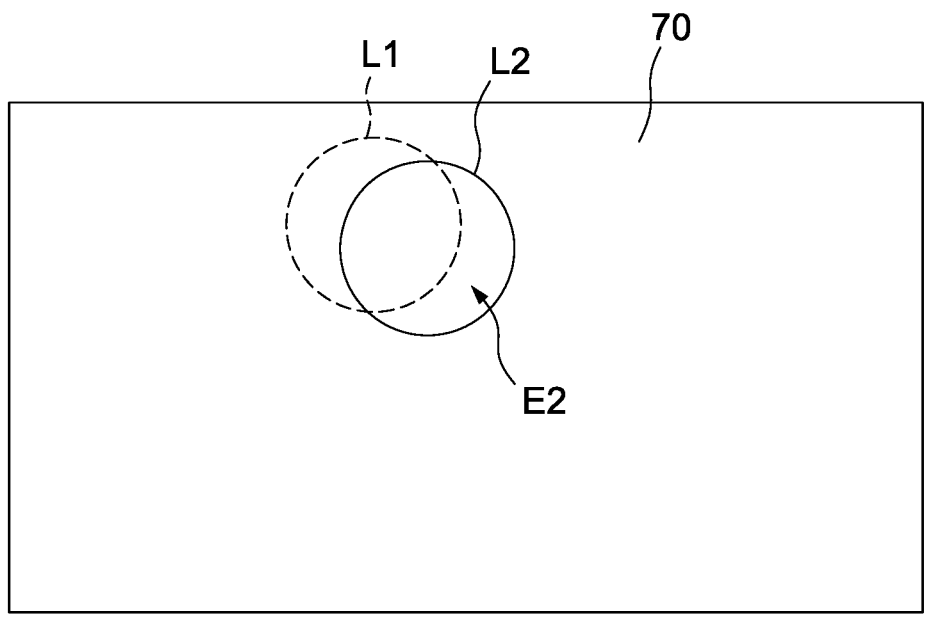
Figure 6C:
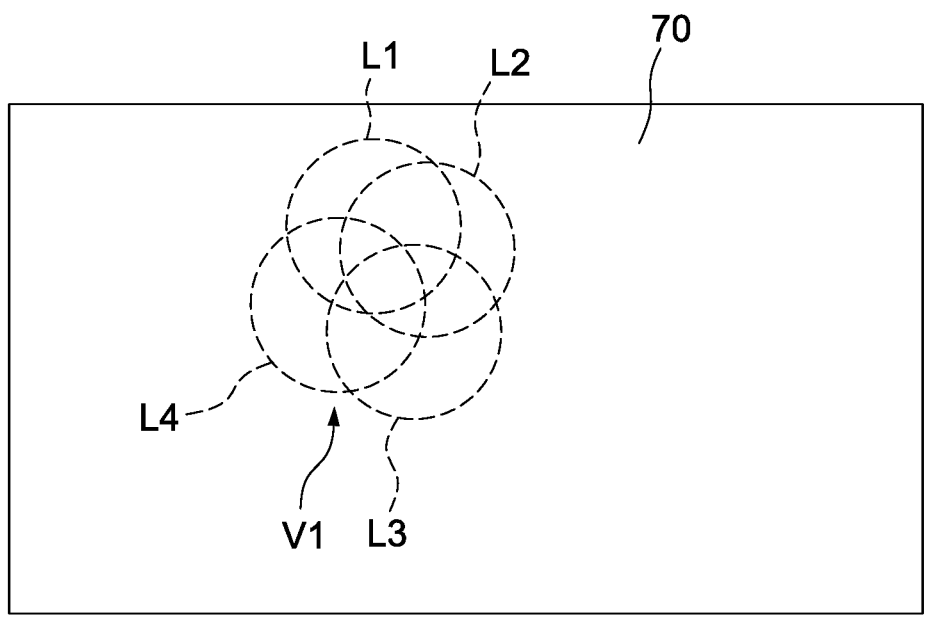

FIG. 6A, FIG. 6B and FIG. 6C illustrate various stages of an example of impinging laser beams according to some embodiments of the present disclosure. In some cases, the area of projection of a laser beam on the sacrificial layer 70 is less than an aperture of the via V1 to be formed. Therefore, two or more laser beams may be used to define the via V1. In FIG. 6A-6C, a solid line may indicate an area of projection of a laser beam on the sacrificial layer 70; a dashed line may indicate an area of the sacrificial layer 70 that has been removed by a laser beam.

Referring to FIG. 6A, a laser beam E1 may be impinged to a location D1 of the sacrificial layer 70.

Referring to FIG. 6B, a laser beam E2 may be impinged to a location D2 of the sacrificial layer 70. In some embodiments, the location D1 may overlap the location D2. In other embodiments, the location D1 may not overlap the location D2

Referring to FIG. 6C, more laser beams may be impinged to locations D3 and D4 of the sacrificial layer 70, respectively, thereby forming the via V1. Although FIG. 6A, FIG. 6B and FIG. 6C illustrate the via V1 is formed by impinging four laser beams, more laser beams may be used to form the via V1. The profile of the V1 may be similar to a circle from a top view. In some embodiments, the profile of the via V1 may have a convex and/or a concave from a top view.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a first conductive layer;
   a dielectric layer disposed on the first conductive layer, the dielectric layer defining an opening exposing the first conductive layer;
   a second conductive layer disposed on the dielectric layer; and
   a connection layer extending from an upper surface of the first conductive layer to a lateral surface of the second conductive layer,
   wherein a surface roughness of an upper surface of the second conductive layer ranges from about 0.5 μm to about 1.25 μm, the lateral surface of the second conductive layer is slanted with respect to a lateral surface of the first conductive layer, a lateral surface of the dielectric layer is slanted with respect to the lateral surface of the first conductive layer, and the lateral surface of the dielectric layer is substantially coplanar with the lateral surface of the second conductive layer.

2. The substrate structure of claim 1, wherein the connection layer defines a recess with an aperture at an open end of the opening, and the aperture is greater than 0 and less than about 60 μm.

3. The substrate structure of claim 1, wherein the second conductive layer has an arris edge defined by the upper surface and the lateral surface of the second conductive layer.

4. The substrate structure of claim 3, wherein an angle defined by the upper surface and the lateral surface of the second conductive layer ranges from about 100° to about 110°.

5. The substrate structure of claim 1, wherein a thickness of the first conductive layer exposed from the opening is substantially equal to a thickness of the second conductive layer adjacent to the opening.

6. The substrate structure of claim 1, wherein the connection layer is in contact with the lateral surface of the dielectric layer.

7. The substrate structure of claim 1, further comprising:
   an electrode structure disposed on the connection layer and fills the opening defined by the dielectric layer.

8. The substrate structure of claim 7, wherein a portion of the electrode structure is at an elevated level with respect to the dielectric layer.

9. The substrate structure of claim 7, wherein a portion of the dielectric layer is exposed from the electrode structure.

10. The substrate structure of claim 7, wherein the electrode structure is conformally disposed on the connection layer.

11. The substrate structure of claim 1, wherein the connection layer continuously extends from the first conductive layer to the second conductive layer.

12. The substrate structure of claim 1, wherein the connection layer comprises a seed layer.

13. The substrate structure of claim 1, wherein a thickness of the second conductive layer is less than about 5 μm.

14. The substrate structure of claim 1, wherein the connection layer has a first lateral surface, a second lateral surface and an upper surface extending between the first lateral surface and the second lateral surface of the connection layer, wherein the first lateral surface of the connection layer is slanted with respect to the second lateral surface of the connection layer.

15. The substrate structure of claim 1, wherein the second conductive layer comprises a pattern configured as an alignment mark.

16. The substrate structure of claim 1, wherein the opening defined by the dielectric layer has a plurality of arc segments from a top view.

* * * * *